(12) United States Patent
Hauenstein

(10) Patent No.: US 7,956,566 B2
(45) Date of Patent: Jun. 7, 2011

(54) DRIVER IC WITH HV-ISOLATION, ESPECIALLY HYBRID ELECTRIC VEHICLE MOTOR DRIVE CONCEPT

(75) Inventor: Henning M. Hauenstein, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 359 days.

(21) Appl. No.: 12/009,721

(22) Filed: Jan. 22, 2008

(65) Prior Publication Data

US 2009/0184760 A1 Jul. 23, 2009

(51) Int. Cl.
*G05B 19/18* (2006.01)
(52) U.S. Cl. .......................... 318/569; 318/600
(58) Field of Classification Search .................. 318/800, 318/801, 569, 600
See application file for complete search history.

(56) References Cited

U.S. PATENT DOCUMENTS 5,363,024 A * 11/1994 Hiratsuka et al. ........ 318/400.08
2004/0000713 A1 * 1/2004 Yamashita et al. ............. 257/728
2005/0274982 A1 * 12/2005 Ueda et al. .................... 257/202

* cited by examiner

*Primary Examiner* — Rina I Duda
(74) *Attorney, Agent, or Firm* — Farjami & Farjami LLP (57) ABSTRACT

An automotive drive system for a high voltage electric motor comprises a microcontroller and ECU powered by a low voltage (12 volt) bus net which controls the drives of a high voltage inverter powered by a 100 volt or higher source, which, in turn, drives the motor. To provide good electrical insulation between the low voltage and high voltage systems, the low voltage control signals are produced by a low voltage signal transmitter chip which has a small integral antenna which wirelessly communicates with the antenna of a high voltage driver IC which drives the power devices of the high voltage inverter. The two IC chips are separated by a suitable isolation distance and may be bare chips, individually packaged chips or co-packed chips. Plural control IC chips and driver IC chips can communicate with one another for adverse control functions, including "smart" functions.

20 Claims, 5 Drawing Sheets

DRIVER IC WITH HV-ISOLATION, ESPECIALLY HYBRID ELECTRIC VEHICLE MOTOR DRIVE CONCEPT

RELATED APPLICATIONS

This application is related to copending application Ser. No. 11/676,029, filed Feb. 16, 2007 in the name of Michael A. Briere (IR-2724) and Ser. No. 12/080,176, filed Apr. 1, 2008 in the name of Henning Hauenstein (IR-3538) each of which are assigned to the assignee of this application.

FIELD OF THE INVENTION

This invention relates to the drive of high voltage semiconductor circuits from a low voltage integrated circuit with high voltage insulation between the two circuits.

BACKGROUND OF THE INVENTION

There is an increasing demand for the management of high currents in a very small space and in harsh environments exposed to large temperature changes. Thus, in the automotive sector, due to increasing electrification functions, the high current demand increases enormously as for inverter and E-motor drives in hybrid car applications, starter-generator applications, and high power DC/DC converters or x-by-wire applications used for electric power steering or electric braking. These applications have high current carrying requirements in a minimum space, challenging state-of the art power modules in terms of achievable power density.

In order to provide sufficiently high power energy sources, the typical 12V automotive battery power net would require currents of about one hundred volts up to thousands amperes. Thus a 42V power net has been employed to provide higher power while keeping the current at reasonable values, in the range of 100 amperes in order to reduce cable thickness and conduction losses ($I^2R$).

Hybrid electric vehicles ("HEV") have now entered the automotive market. Equipped with huge electric motors such cars can be operated without the combustion engine. These E-motors are typically in the power range of 15 kW to over 100 kW. Correspondingly the voltage of the power source driving these motors had to be increased beyond the HV net. Then, even 42V was not enough to keep the phase currents of those high power motors and applications to a reasonable order of magnitude.

Therefore, HEVs are equipped with a so called dual power net or dual bus voltage system. Conventional electric systems are still powered by the 12V battery. However, in order to power the E-Motors and power intensive auxiliary systems a second very high voltage battery has been introduced. This is normally a NiMH or a Li-Ion battery with output voltages of from 150V to over 600V with good energy storage capabilities. Instead of having a 600V battery, a lower voltage battery, e.g. 150-300V can be boosted to 600V or greater via a DC/DC converter.

The existence of a high voltage system in HEVs causes a major challenge: the 12V powered systems need to be well protected from the high voltage system since standard automotive blocking and protection circuits are not dimensioned to withstand more than 30V or 40V. Even the known 42V system specifications do not allow more than 60V in the entire power net due to safety reasons.

With a high voltage source in the car the low voltage (LV) and high voltage (HV) power supplies need to be very well isolated from each other. Otherwise the LV components would immediately be destroyed by accidental direct contact to the HV net. In addition to the electrical damage the HV bus also needs to be secured against accidental contact by humans. Thus, the 12V battery was relatively safe and not life threatening; an accidental contact to the new HV power net can be deadly. Therefore, the HV power circuit needs to be 100% safe and protected from any accidental contact by humans. Correspondingly it must be assured that the LV power net, which can normally be touched, is well isolated from the dangerous HV circuit.

This isolation problem between the LV and HV bus is quite complicated since the two electric circuits in a car still need to communicate with each other. For example all the microcontrollers and other control elements such as Electric Control Units (ECUs) are integrated in the 12V power net. These microcontrollers and computers determine the various drive modes and control the entire behavior of the overall system. Therefore these microcontrollers need to send commands to the HV control electronics. Specifically, the HV gate driver integrated circuits (ICs) which control the high power motor control electronics need to exchange information and commands from the LV electronics.

Figure 1:
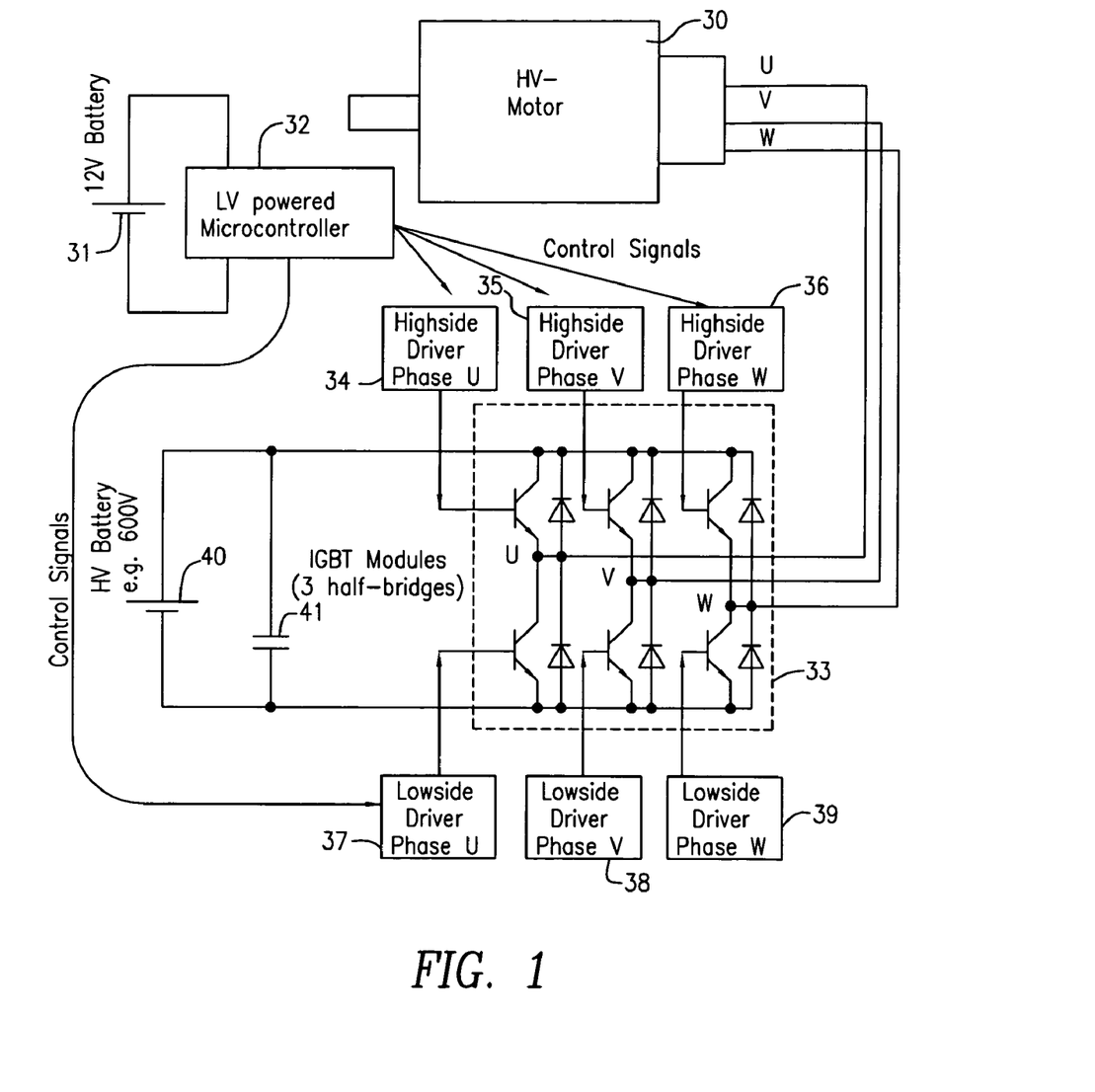
FIG. 1 schematically shows a known typical E motor drive system with HV and LV power networks.

FIG. 1 shows a typical E motor drive system for E motor 30. A low voltage microcontroller 32 (and its ECU—not shown) is powered by low voltage battery 31 (12 volts) and controller 32 is coupled to the drivers of a high voltage inverter consisting of three half bridge IGBTs within dotted box 33. A high voltage battery 40 (600 volts) and filter capacitor 41 powers inverter 33. Each IGBT has a suitable IC driver, shown as high side drivers 34, 35 and 36, and low side drivers 37, 38 and 39 for E motor phases U, V and W. The low voltage system microcontroller 32 must be coupled to the high voltage side of the system to drive as schematically shown by the lines labeled "control signals".

Figure 2:
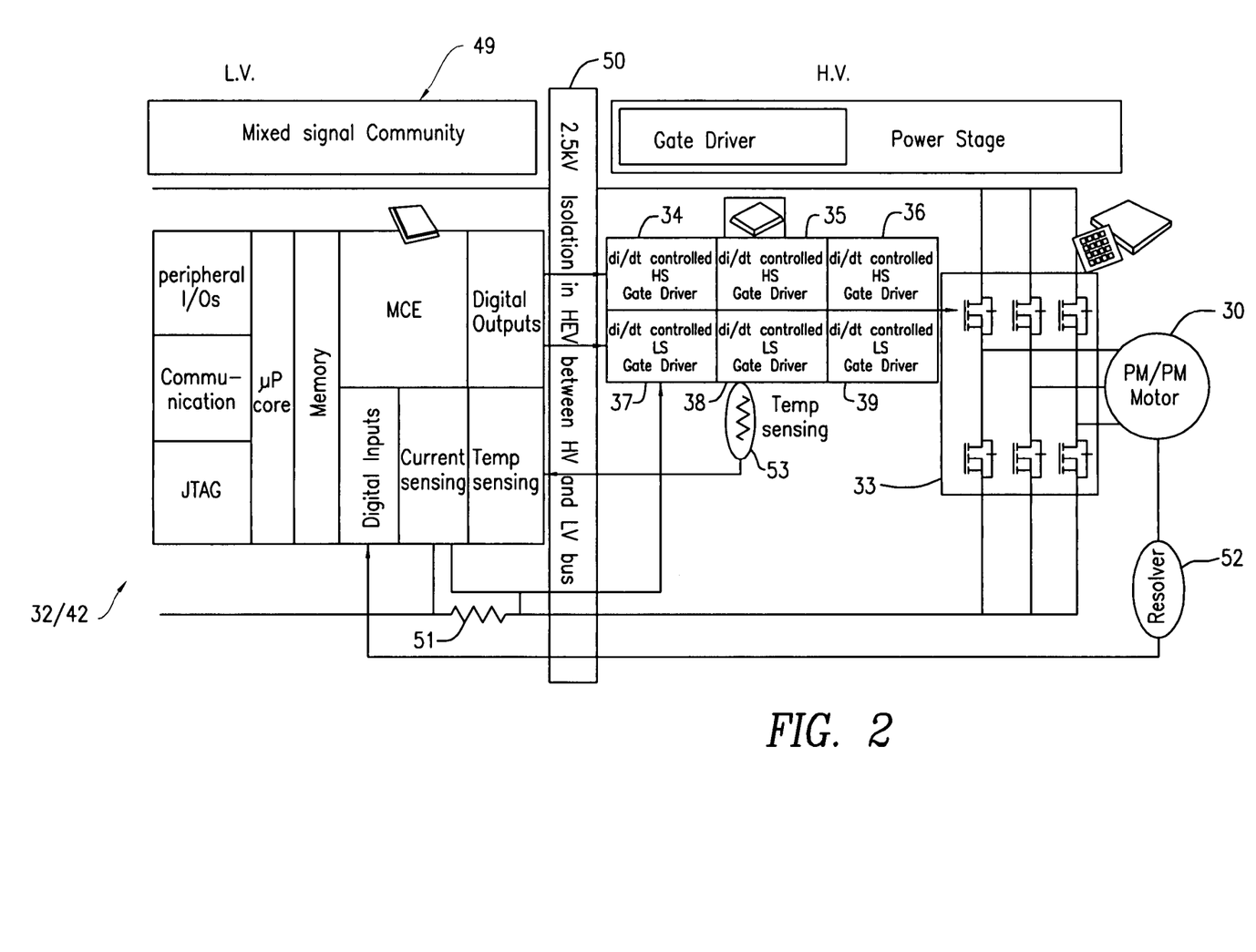
FIG. 2 shows the system of FIG. 1 in further detail to include the ECU in the LV circuit, and shows the prior art isolation barrier between the LV and HV sections or nets.

As previously stated, it is necessary to isolate the LV network (shown with the microcontroller and the ECU in block diagrammatic form) from the HV circuit. FIG. 2 schematically illustrates a prior art type of isolation barrier 50, known for such circuits. Typically the isolation should be capable of insulating 2 times the HV bus voltage plus 1 kV. (2200 volts in the case of FIG. 2.) With typical HV bus voltages of greater than about 500 volts, the isolation will be in the range of greater than 2 kV to 4 kV. It has been very difficult to establish such a high isolation which is reliable and rugged enough for harsh automotive conditions.

In FIG. 2, the low voltage system to the left of barrier 50 is powered by the battery 31 in FIG. 1 and includes the mixed signal controller 49 and a related electronic control circuit. Microprocessor 32 and its ECU 42 have the conventional functions as indicated in FIG. 2. Thus, digital outputs to the high side and low side drivers are taken through barrier 50. Current sense resistor 51 is also coupled through barrier 50 and resolver 52 is coupled back through barrier 50 to the digital inputs in the LV microcontroller 50. A temperature sense device 53 in the HV side of the system is similarly coupled back to a temperature sensing input in L.V. control 49.

These connections through the isolation barrier 50 conventionally employ opto-couplers, capacitive couplers, inductive couplers and/or transformers. The signals are exchanged via these couplers which have to provide the kV isolation.

The main disadvantage of such isolation is that each signal connection must be separately isolated.

Therefore, just the gate driver signals for the full bridge inverter requires 6 couplers (3 high side and 3 low side). The sensor signals indicated in FIG. 2 require even more couplers.

Major disadvantages of prior art solution are the cost and the space requirements for those couplers.

In addition, those components must be very reliable, require very expensive components to withstand the typical "under the hood" requirements of an automotive application over its lifetime. Also, degradation of the isolation layers (e.g. in capacitive couplers) and the degrading in performance of the optics of the opto-couplers is a major concern and the automotive industry has been reluctant to use them. Transformers are, therefore, often preferred but are an expensive and space consuming choice. Therefore it is desirable to find an alternative solution to those prior art couplers.

In order to address some of the above mentioned problems with the signal isolation it is also known to provide on-chip isolation between the HV and LV sections of a single IC. For example, a solution called "core-less transformer on chip" is known. The gate driver IC of that solution provides a transformer structure on a chip, established by integrating metal coils in the semiconductor process. Due to the near proximity of the two transformer coils on one IC no classical "core" is used. The isolation layer is provided by an isolating structure of the semiconductor process, e.g. a nitride or oxide layer. The disadvantage of this coreless-transformer-IC solution is that the kV-isolation fully depends on the integrity and ruggedness of the IC process. Any defect of the isolating layer will connect the LV to the HV section of the power net. Therefore, reliability is a serious concern for this solution. In addition the core-less-transformer structure requires a lot of space in order to guarantee greater than 2 kV isolation. The increased silicon chip area also increases the cost of such a gate driver IC beyond that of the area needed for the gate driver function only.

BRIEF DESCRIPTION OF THE INVENTION

In accordance with the invention, a wireless transmission combination is used as the signal interface between the LV and HV circuit. A gate driver IC in the HV system according to the invention provides an antenna structure (for receiving and/or transmitting signals) and is powered by the HV supply. In the following this chip is called the HV Driver IC. A second chip (in the following called LV Signal-Transmitter) is physically separated from the main HV driver IC and is powered by the LV power supply. The LV signal transmitter is directly connected to signal pins of the LV controller elements (e.g. microcontrollers, DSPs, other digital ICs) which have to exchange signals with the HV driver IC. This LV signal transmitter also contains an antenna structure for uni- or bidirectional signal transmission.

The two chips are physically separated and isolated to produce the required kV-isolation (2.5 kV for example) and are wirelessly coupled through their antennas. The isolation value will depend on the specific application requirements. Antenna structures are provided within the two chips and are formed in suitable metal layers used in the IC-semiconductor process. The antennas can have various embodiments and may be linear dipole antennas or more complex spirals or circular structures surrounding the IC or parts of it.

The invention offers the following advantages:
a) Safe high voltage isolation due to a well isolated 2 chip structure.
b) Flexible and variable isolation values due to the mechanical separation of the HV driver IC and LV signal transmitter IC.
c) Cost effective solution since the isolation layer is not on the silicon IC chip. Therefore no silicon area is wasted for isolation.
d) The LV signal-transmitter can be very small since its main function is the wireless transmission of various control signals from a LV microcontroller to the HV driver IC and the reception of feed back signals.
e) The LV signal-transmitter and HV driver IC may be combined into a single multi-chip-package (co-package) by providing two respective separated and kV isolated pads or leadframes within the package.
f) The ruggedness and reliability of the isolation between the LV signal-transmitter and the HV driver IC can be adjusted by the choice of isolating material, such as the package mold mass itself or any suitable plastic or other non-conductive dielectric material or the like.
g) The 2 chips can be in close proximity to each other since the wireless signal transfer needs to bridge only a very short distance, e.g. a few millimeters, depending on the isolation requirement of the 2 chips. Therefore the signal power can be very small and does not disturb other wireless devices. A major advantage to the invention is the very strong local focus of the transmission so that no EMI or other emission regulations are impacted by this signal transfer.
h) A signal guiding structure between the two antennas can be provided (e.g. a metal "tunnel") acting as electromagnetic wave guide filled with isolating dielectric material.
i) A metal screen may be fixed outside the package to keep the signal transmission focused between the two chips and to screen the two chips from external radiation and noise.
j) By using a more complex frequency/amplitude modulation or by using a simple transmission protocol, a broadband multi-signal transmission can be exchanged between the two chips so that many different standard coupler devices which are normally required for each single signal line can be replaced by one wireless transmission.
k) The communication between the two chips can be bi-directional so that the HV driver IC can also send signals back to the LV microcontroller. Thus, the HV driver can provide status feedback and diagnostic information from the HV motor to the LV control elements running the operation software. Bi-directional communication is an important feature for smart gate driver ICs such as the half bridge driver ICs types IR2114, IR2214, IR2630 sold by the International Rectifier Corporation of El Segundo, Calif. These types of drivers may be employed as the HV driver IC according to this invention just by adding the disclosed antenna structure and communication logic.
l) Reduction of components compared to state-of-the-art isolation concepts using opto, capacitive or inductive couplers.
m) Reduced space requirements.
o) Reduced complexity of the circuit.
p) Reduced cost.
q) Increased reliability due to a smaller component count and rugged isolation between mechanically separated ICs.
r) Reduced degradation of the transmission elements compared to that of an opto-coupler.
s) The possibility of active control of the transmission power and adjustment of the transmission signal strength, depending on the environmental and EMI noise conditions.

The invention can be used in numerous applications in the power management market, especially motor drive applications like hybrid electric vehicle traction motors, generators, electric power steering motors, etc., employing communication between 2 different insulated voltage circuits. The invention can also be employed with non-automotive applications where reliable communication between isolated electric circuits is required.

DETAILED DESCRIPTION OF THE DRAWINGS

Figure 3:
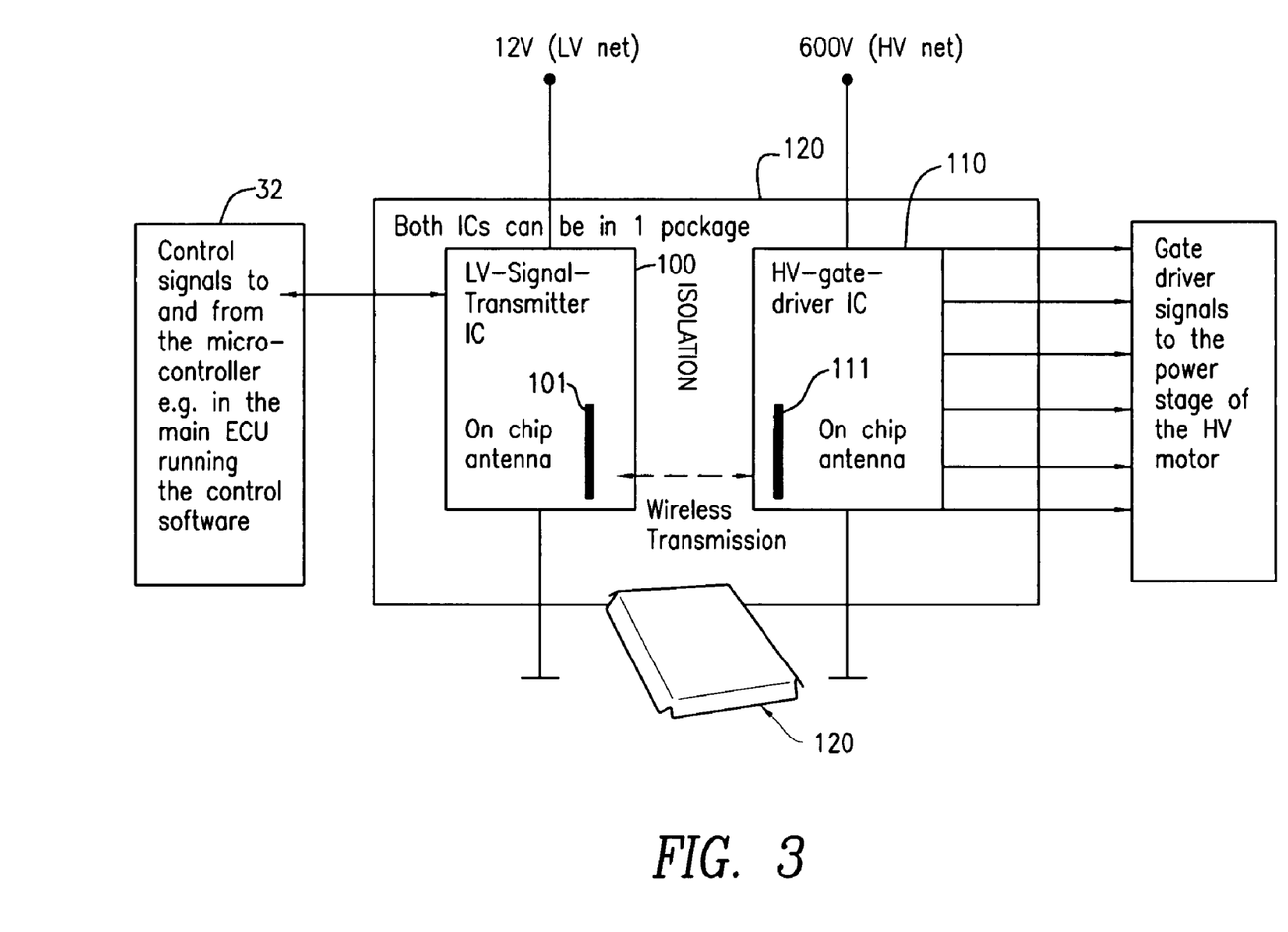
FIG. 3 shows a first embodiment of the invention in which the LV signal transmitter IC and HV gate driver IC used for the isolation barrier of the invention are copacked in a common package and are in wireless communication.

Referring first to FIG. 3, there is shown a first semiconductor IC chip 100 which is the LV signal transmitter IC of FIG. 2, adapted however with an on chip antenna 101. Control signals from control circuit 32/49 of FIG. 2 in the 12 volt network running the control software drives IC 100 which would be the left hand side of barrier 50 in FIG. 2. A spaced HV gate driver IC 110 also having an on chip antenna 111 is spaced from IC by a distance of, for example, 5 millimeters or as needed to provide the full isolation between the LV and HV networks and would be on the right hand side of barrier 50 in FIG. 2. The IC 110 then provides the necessary gate driver signals to the power stage of the HV motor 30, for example, drivers 34 to 39 of FIG. 2 the current and temperature sensors and the like. The barrier 50 of FIG. 2 then consists of the physical gap between ICs 100 and 110, which is traversed by the wireless transmission between the two ICs.

The ICs 100 and 110 can be co-packed in a common plastic housing or package 120 as shown in FIG. 3 and are insulated from one another by the package plastic or dielectric. Thus, in the assembly of FIG. 3, communication between ICs 100 and 110 is wireless over a very short distance. Isolation is provided by the mechanical spacing and the dielectric material between the two chips.

Figure 4:
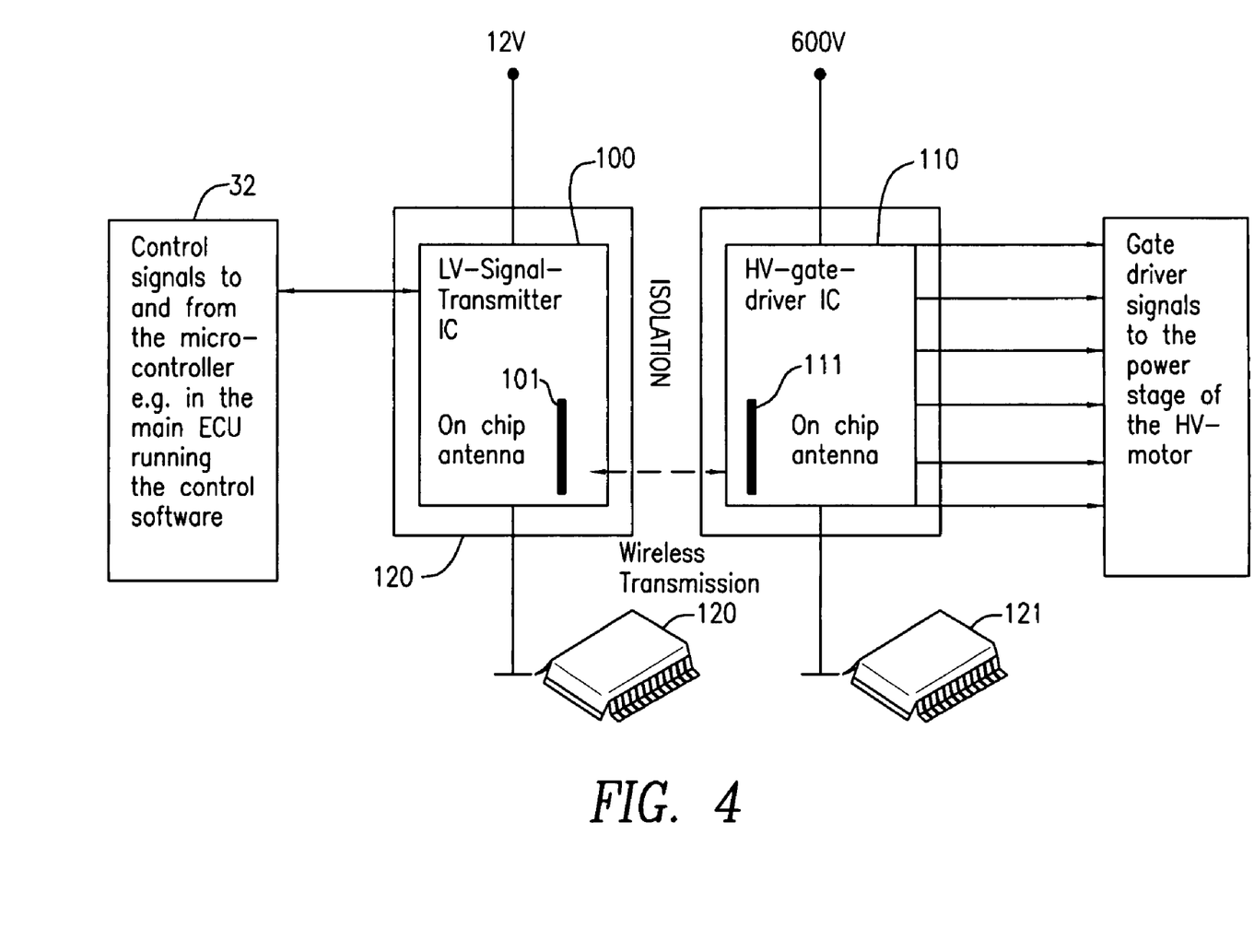
FIG. 4 shows a second embodiment of the invention in which the LV signal transmitter IC and the HV gate driver IC are in separated respective packages.

FIG. 4 shows a further embodiment of the invention in which LV signal transmitter IC chip 100 and HV gate driver IC chip 110 are separately housed in packages 120 and 121 respectively. The communication between the ICs is again wireless and isolation is provided by the mechanical distance between ICs 100 and 110. Again, the LV signal transmitter IC 100 is electrically connected to the 12V power supply and to microcontroller unit and to the main ECU 32/49 which are part of the 12V system. The HV driver IC 110 is directly connected to the power stage (e.g. IGBTs, MOSFETs, temperature and current sensors and the like) driving E-motor 30 of FIG. 1. The communication between ICs 100 and 110 is again wireless over a very short distance by mounting the two components next to each other but suitably spaced, as on a printed circuit board.

If desired, the 2 ICs 100 and 110 may be unhoused bare die mounted directly on a common substrate such as FR4, DBC, IMS or the like and spaced from and insulated from one another by a suitable lateral spacing to provide the necessary isolation.

Figure 5:
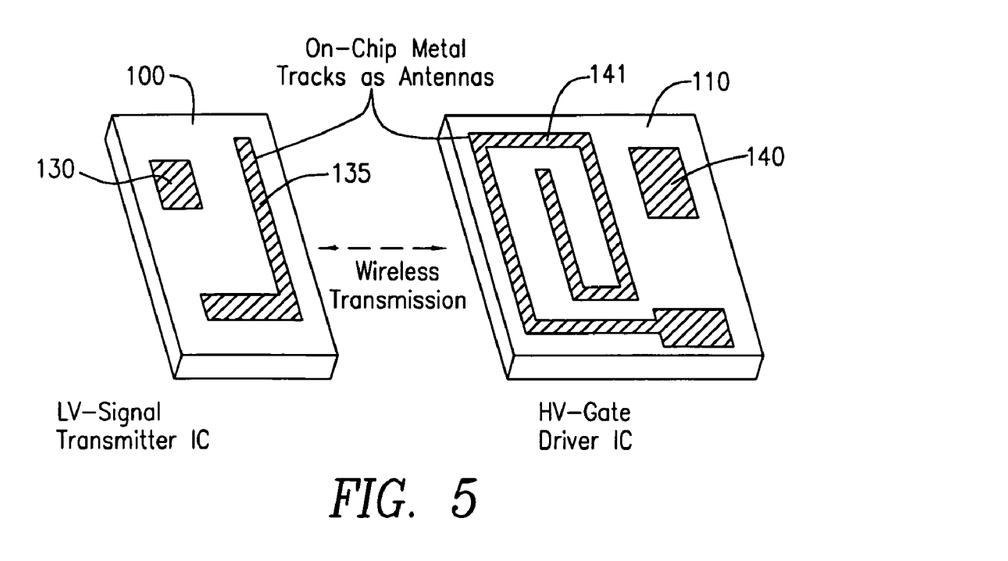
FIG. 5 shows the 2 ICs of FIGS. 3 and 4 with on-chip metal traces within their respective chip or die forming the antenna structures.

FIG. 5 shows a further embodiment of the invention in which the antenna structures are formed in a metal layer which may be otherwise used in the process employed to manufacture the IC. Thus, a metal layer in the silicon, GaN or other process to make chip 100 may be etched to form plural electrodes, including, for example, electrode 130 (for any IC purpose). At the same time, a suitable masking pattern can define antenna 135.

Similarly, for IC 110, the process which defines top exposed electrode 140 in chip or die 110 also defines antenna 141.

Figure 6:
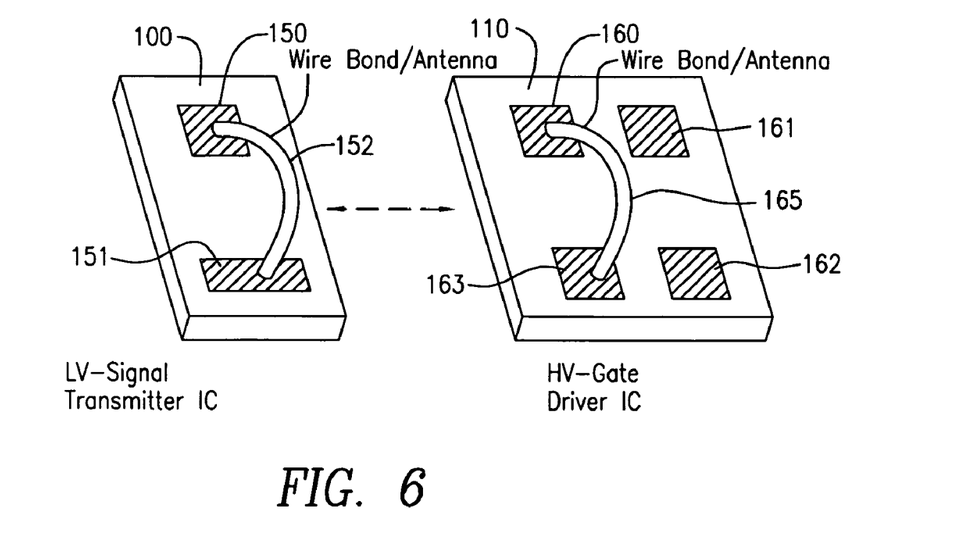
FIG. 6 shows the 2 ICs of FIGS. 3 and 4 with on-chip wire bonds serving as the antennas for their wireless communication.

FIG. 6 shows a further embodiment of chips 100 and 110 in which chip 100 has electrodes 150, 151 which are connected by an outwardly looped wire bond 152 which may serve as the antenna for chip 100. Similarly, chip 110 has metal electrodes 160, 161, 162 and 163 and a wire bond 165 between electrodes 160 and 163 which serves as its antenna which communicates with antenna 152.

In FIGS. 5 and 6, the chips 100 and 110 may be bare chips closely mounted on a common substrate or may be individually packaged or copacked as previously described.

In each of the above embodiments, the gate driver IC 100 may have additional smart functions including those in existing smart gate driver products such as the IR2114, IR2214 parts of International Rectifier Corporation with motor protection circuits and/or soft shut down functions, for example.

Any combination of several LV transmitter ICs and several HC driver-ICs can also be used to form a communication network with isolation.

In addition one HV driver-IC 110 can exchange signals with two or more LV transmitter-ICs 100, or vice versa, one LV transmitter-IC 100 can communicate with two or more HV-driver-ICs. Note that only e.g., one LV-transmitter can communicate with all 3 half bridge driver ICs for the 3 phases of a motor power stage.

Further, in accordance with the invention plural HV driver ICs 110 may take advantage of the wireless communication capability to exchange signals and information among each other via their antennas. Thus, one half bridge driver may recognize a fault situation in its phase and send this status flag signal via its antenna to the other two half bridge drivers which are mounted in close proximity to each other. Similarly, different LV driver-ICs 100 may communicate with each other via their antennas. Therefore, the wireless communication capability allows simplification of the main electric circuitry withing the LV or HV circuitry since the various ICs can "talk to" each other without the need for a physical electric connection on their support PCBs.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. An insulation barrier system in an electrical system for safely transferring control signal information from a low voltage system to a high voltage system;

said insulation barrier comprising a signal transmitter first IC chip having an output antenna for wirelessly transmitting signal information and a second IC chip spaced from and insulated from said first chip and having an antenna for receiving wireless signals from said antenna on said first IC chip and having outputs to said high voltage system.

2. The barrier of claim 1, wherein said low voltage system is a 12 volt system and said high voltage system is a greater than 100 volt system.

3. The system of claim 1, wherein said first and second chips are separately housed in respective insulation housing.

4. The system of claim 1, wherein said first and second chips are copacked and insulated from one another in a common insulation housing.

5. The system of claim 1, wherein at least one of said antennas is formed from a metal layer in its respective IC chip.

6. The system of claim 1, wherein at least one of said antennas is formed by a wire bond on the surface of its respective IC chip.

7. An insulation barrier system for transferring information between an electronic controller in a low voltage system and a high voltage component in a high voltage system using an insulation barrier, said insulation barrier comprising:
 a low voltage transmitter IC chip including an antenna for wirelessly transmitting control signals from said electronic controller to a high voltage driver IC chip;
 said high voltage driver IC chip including an antenna for wirelessly receiving said control signals from said low voltage transmitter IC chip to drive said high voltage component, said high voltage driver IC chip spaced from and insulated from said low voltage transmitter IC chip.

8. The system of claim 7, wherein said low voltage system is a 12 volt system and said high voltage system is a greater than 100 volt system.

9. The system of claim 7, wherein said insulation barrier is sufficient to insulate against a voltage of about twice that of said high voltage system plus 1 kV.

10. The system of claim 7, wherein said low voltage transmitter and high voltage driver IC chips are separately housed in respective insulation housing.

11. The system of claim 7, wherein said low voltage transmitter and high voltage driver IC chips are copacked and insulated from one another in a common insulation housing.

12. The system of claim 7, wherein at least one of said antennas is formed from a metal layer in its respective IC chip.

13. The system of claim 7, wherein at least one of said antennas is formed by a wire bond on the surface of its respective IC chip.

14. The system of claim 7, wherein said low voltage transmitter and high voltage driver IC chips are spaced from each other by around 5 millimeters.

15. An insulation barrier system for transferring information between an electronic controller in a low voltage system and an electric motor in a high voltage system using an insulation barrier, said insulation barrier comprising:
 a low voltage transmitter IC chip including an antenna for wirelessly transmitting control signals from said electronic controller to a high voltage driver IC chip;
 said high voltage driver IC chip including an antenna for wirelessly receiving said control signals from said low voltage transmitter IC chip to drive a high voltage power stage, said high voltage power stage configured to controllably connect high voltage power from said high voltage system to said electric motor, said high voltage driver IC chip spaced from and insulated from said low voltage transmitter IC chip.

16. The system of claim 15, wherein said low voltage system is a 12 volt system and said high voltage system is a greater than 100 volt system.

17. The system of claim 15, wherein said low voltage transmitter and high voltage driver IC chips are copacked and insulated from one another in a common insulation housing.

18. The system of claim 15, wherein said high voltage driver IC chip is configured to provide status feedback and diagnostics from said electric motor to said electronic controller.

19. The system of claim 15, wherein said electric motor comprises a multiphase a-c motor and said high voltage power stage includes a multiphase inverter for converting the voltage of a high voltage source to a multiphase voltage connected to said electric motor.

20. The system of claim 15, wherein said high voltage power stage comprises gated semiconductor switch devices to be driven by said high voltage driver IC chip.

* * * * *

UNITED STATES PATENT AND TRADEMARK OFFICE
CERTIFICATE OF CORRECTION

| | | |
|---|---|---|
| PATENT NO. | : 7,956,566 B2 | Page 1 of 1 |
| APPLICATION NO. | : 12/009721 | |
| DATED | : June 7, 2011 | |
| INVENTOR(S) | : Hauenstein | |

It is certified that error appears in the above-identified patent and that said Letters Patent is hereby corrected as shown below:

Title Page, Item (54) Title; and Column 1, Line 1, "DRIVER" should be changed to --GATE-DRIVER--.

Signed and Sealed this
Twenty-ninth Day of November, 2011

David J. Kappos
*Director of the United States Patent and Trademark Office*